United States Patent
Chiou et al.

(10) Patent No.: US 7,939,941 B2
(45) Date of Patent: May 10, 2011

(54) FORMATION OF THROUGH VIA BEFORE CONTACT PROCESSING

(75) Inventors: Wen-Chih Chiou, Miaoli (TW);
Chen-Hua Yu, Hsin-Chu (TW);
Weng-Jin Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 256 days.

(21) Appl. No.: 11/769,559

(22) Filed: Jun. 27, 2007

(65) Prior Publication Data

US 2009/0001598 A1 Jan. 1, 2009

(51) Int. Cl.
*H01L 23/48* (2006.01)
*H01L 23/52* (2006.01)
*H01L 29/40* (2006.01)

(52) U.S. Cl. ................... 257/758; 257/E23.01
(58) Field of Classification Search .............. 257/758, 257/E23.01
See application file for complete search history.

(56) References Cited

U.S. PATENT DOCUMENTS

| | | | |
|---|---|---|---|
| 5,627,106 A * | 5/1997 | Hsu ............... | 438/459 |
| 5,640,049 A | 6/1997 | Rostoker et al. | |
| 5,756,395 A * | 5/1998 | Rostoker et al. ........... | 438/622 |
| 6,187,677 B1 | 2/2001 | Ahn | |
| 6,239,495 B1 | 5/2001 | Sakui et al. | |
| 6,355,950 B1 | 3/2002 | Livengood et al. | |
| 6,495,454 B2 | 12/2002 | Livengood et al. | |
| 6,583,045 B1 | 6/2003 | Liu et al. | |
| 6,599,778 B2 | 7/2003 | Pogge et al. | |
| 6,642,081 B1 * | 11/2003 | Patti ............... | 438/109 |
| 6,818,931 B2 | 11/2004 | Liu et al. | |
| 6,841,469 B2 | 1/2005 | Sawada et al. | |
| 6,897,125 B2 | 5/2005 | Morrow et al. | |
| 7,365,418 B2 | 4/2008 | Hsu | |
| 7,402,515 B2 * | 7/2008 | Arana et al. .......... | 438/639 |
| 7,615,841 B2 | 11/2009 | Chen et al. | |
| 7,786,584 B2 | 8/2010 | Barth et al. | |
| 2002/0164839 A1 * | 11/2002 | Enquist ............ | 438/119 |
| 2003/0232488 A1 * | 12/2003 | Chua et al. ........... | 438/460 |
| 2005/0042867 A1 * | 2/2005 | Sanchez et al. ........... | 438/684 |
| 2005/0121768 A1 | 6/2005 | Edelstein et al. | |
| 2005/0139954 A1 * | 6/2005 | Pyo ............... | 257/531 |
| 2006/0027934 A1 | 2/2006 | Edelstein et al. | |
| 2006/0057836 A1 | 3/2006 | Nagarajan et al. | |
| 2007/0126041 A1 | 6/2007 | Shinoda et al. | |
| 2007/0216041 A1 * | 9/2007 | Patti et al. ............ | 257/797 |
| 2008/0020488 A1 * | 1/2008 | Clevenger et al. ........ | 438/3 |
| 2008/0073747 A1 * | 3/2008 | Chao et al. ............ | 257/520 |
| 2008/0206984 A1 * | 8/2008 | Sparks et al. ............ | 438/637 |
| 2008/0220565 A1 * | 9/2008 | Hsu et al. ............ | 438/109 |
| 2009/0224371 A1 * | 9/2009 | Yu et al. ............ | 257/621 |

FOREIGN PATENT DOCUMENTS

CN 1858908 A 11/2006
JP 2007 250 561 A 9/2007

* cited by examiner

*Primary Examiner* — Kiesha R Bryant
*Assistant Examiner* — Igwe U Anya
(74) *Attorney, Agent, or Firm* — Slater & Matsil, L.L.P.

(57) ABSTRACT

The formation of through silicon vias (TSVs) in an integrated circuit (IC) die or wafer is described in which the TSV is formed in the integration process prior to contact or metallization processing. Contacts and bonding pads may then be fabricated after the TSVs are already in place, which allows the TSV to be more dense and allows more freedom in the overall TSV design. By providing a denser connection between TSVs and bonding pads, individual wafers and dies may be bonded directly at the bonding pads. The conductive bonding material, thus, maintains an electrical connection to the TSVs and other IC components through the bonding pads.

13 Claims, 13 Drawing Sheets

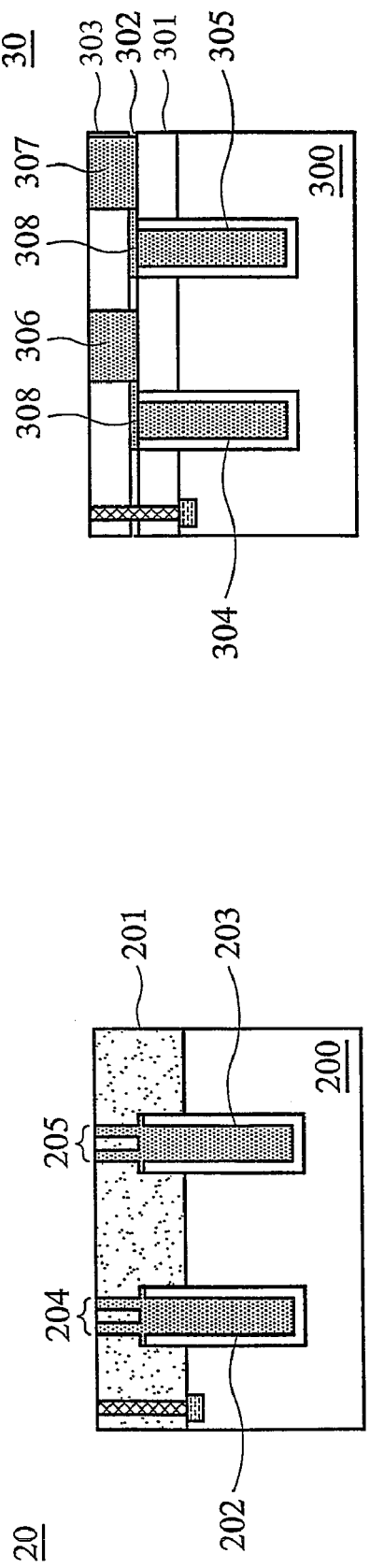
FIG. 2
FIG. 3
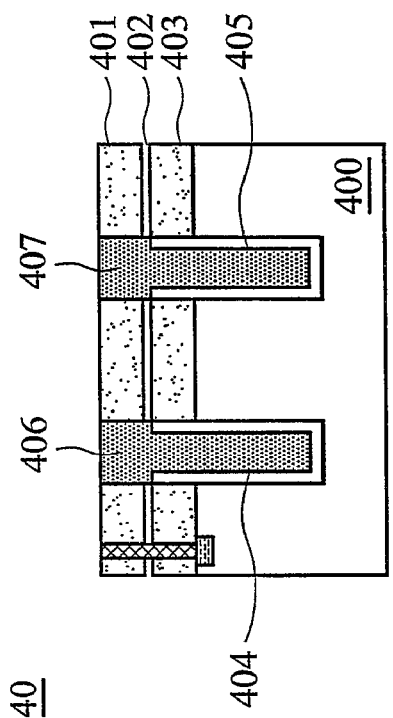
FIG. 4

Position a first wafer which has one or more bonding pads connected to at least one through silicon via (TSV) that provides an electrical connection to one or more components on the first wafer. —1000

Position a second wafer in relation to the first wafer, the second wafer having one or more bonding pads connected to at least one TSV that provides the electrical connection to one or more components on the second wafer. —1001

Bond the bonding pads of the first and second wafers using a material, such as copper, tungsten, gold, copper-tin ally, gold-tin alloy, indium-gold alloy, lead-tin alloy, or the like, that is electrically compatible with the bonding pads. —1002

FIG. 10

FORMATION OF THROUGH VIA BEFORE CONTACT PROCESSING

TECHNICAL FIELD

The present invention relates generally to integrated circuit fabrication, and more particularly to forming a through via before contact processes.

BACKGROUND

Generally, the speed at which an integrated circuit operates is influenced by the distance between the farthest separated components that communicate with each other on the chip. Laying out circuits as three-dimensional structures has been shown to significantly reduce the communication path length between on-chip components, provided the vertical distances between the layers are much smaller than the chip width of the individual layers. Thus, by stacking circuit layers vertically, the overall chip speed is typically increased. One method that has been used to implement such stacking is through wafer bonding.

Wafer bonding is the joining together of two or more semiconductor wafers on which integrated circuitry has been formed. Wafers are typically joined by direct bonding of external oxide layers or by adding adhesives to inter-level dielectric (ILD) layers. The bonded result produces a three-dimensional wafer stack which is subsequently diced into separate "stacked die," with each individual stacked die having multiple layers of integrated circuitry. In addition to the increased speed that the three-dimensional circuitry typically experiences, wafer stacking offers other potential benefits, including improved form factors, lower costs, and greater integration through system on chip (SOC) solutions. In order to enable the various components integrated within each stacked die, electrical connections are provided that provide conductors between vertical layers. Through silicon vias (TSVs) are typically fabricated to provide vias filled with a conducting material that pass completely through the layer to contact and connect with the other TSVs and conductors of the bonded layers.

In general, TSVs are formed after the contact process or even after the top metallization process. Examples of such post-process methods are described in U.S. Pat. No. 6,642,081 to Patti (hereinafter Patti) and U.S. Pat. No. 6,897,125 to Morrow, et al., (hereinafter Morrow). Patti describes forming the TSV after the top metallization, while Morrow describes TSV formation after formation of the first contact or interconnect structure. One disadvantage of forming TSVs after the contact or metallization process is that the density of the via is typically less because of etch and design limitations. Etching through metallization layers does not typically result in a recess that would allow for a particularly dense TSV. Moreover, again because the process etches through metallization and contact regions, the design of the via is limited based on the existing structures of the metallization layers and contact regions. Thus, designers will typically have to design the TSV network around the existing metal layers and contact traces. This limited design and density potentially creates connection, contact, and reliability problems.

An additional limitation to current TSV systems and methods is the limited availability for thermal dissipation. For example, Morrow and Patti disclose TSV processes, where the TSVs are formed after contact or metallization processing. Therefore, should there be a desire to design TSVs for thermal dissipation, those TSVs will typically occupy the area for normal design, since the contact and metallization layers are already in place.

SUMMARY OF THE INVENTION

These and other problems are generally solved or circumvented, and technical advantages are generally achieved, by preferred embodiments of the present invention which provide for the formation of through vias (TVs), such as through silicon vias (TSVs), in an integrated circuit (IC) die or wafer prior to contact or metallization processing. Contacts and bonding pads may then be fabricated after the TSVs are already in place, which enables individual wafers and dies to be bonded in stacks from the bonding pads. The bonding material provides complete electrical connection to the TSVs through the bonding pads.

In accordance with a preferred embodiment of the present invention, a method for forming one or more TVs includes forming one or more recesses in a first wafer prior to depositing an interlayer dielectric (ILD) layer. The recesses extend from a front-side surface of the first wafer to a predetermined distance from a back-side surface of the wafer. Conductive material is then deposited into the recesses to form the TV.

In accordance with a preferred embodiment of the present invention, a stacked IC includes a first component located on a first semiconductor die and one or more additional components located on one or more additional dies. The first semiconductor die and the one or more additional dies are vertically attached by a bonding medium, while the first component and the one or more additional components are electrically connected. There is at least one TSV located in at least one of the first semiconductor die and additional dies, where the TSV is formed prior to forming contacts for the stacked IC.

In accordance with another preferred embodiment of the present invention, a semiconductor component includes at least one wafer having a TV formed prior to deposition of a contact dielectric layer.

In accordance with another preferred embodiment of the present invention, a semiconductor component includes one or more dies each having one or more devices integrated therein. There is also at least one TSV, which is formed prior to creation of any contacts. The front-end of the TSV is electrically connected to contacts on the front-side of the TSV's corresponding die. The back-end of the TSV is exposed and available for providing electrical conduction after removing a portion of the substrate on the back-side of the corresponding die.

In accordance with another preferred embodiment of the present invention, a method for bonding one or more wafers includes positioning a first wafer, which has one or more bonding pads connected to at least one TV that provides an electrical connection to one or more components on the first wafer. A second wafer is positioned in relation to the first wafer. The second wafer also has one or more bonding pads connected to at least one TV that provides the electrical connection to one or more components on the second wafer. The bonding pads of the first and second wafers are bonded together using a material that is electrically compatible, such that electricity may be conducted between the bonding pads of the first and second wafers when the bonding is complete.

In accordance with another preferred embodiment of the present invention, a method includes forming at least one TSV in a first IC die. After the TSV is formed, the first IC die is processed adding one or more contacts and one or more bonding pads. At least one additional TSV is formed in an additional IC die, after which the additional IC die is processed to also add one or more contacts and one or more bonding pads. The bonding pads of the two IC die are joined using a rigid conducting material.

An advantage of a preferred embodiment of the present invention is that TSV density can be increased for three-dimensional integrated circuits when formed prior to the contact and metallization processing. A denser TSV provides a better and more reliable connection to the underlying devices and components.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a cross-sectional view of a wafer having through vias formed in the substrate and dielectric layers according to one embodiment of the present invention;

FIG. 3 is a cross-sectional view of a wafer having vias formed in the substrate and TSV dielectric layer according to one embodiment of the present invention;

FIG. 4 is a cross-sectional view of a wafer having vias formed in the substrate and TSV dielectric layer according to one embodiment of the present invention;

FIG. 10 is a flowchart illustrating example steps executed to implement one embodiment of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
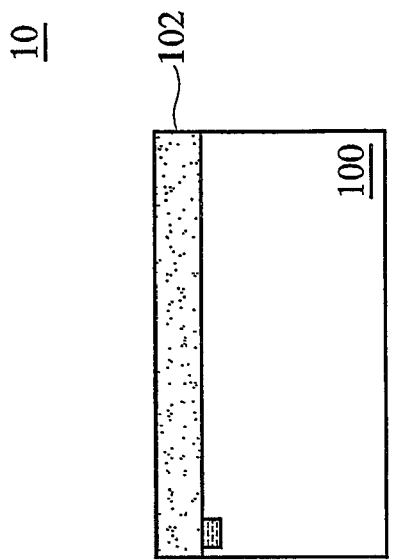
FIGS. 1A-1M are cross-sectional views of a wafer having a TSV formed according to one embodiment of the present invention.
Figure 1B:
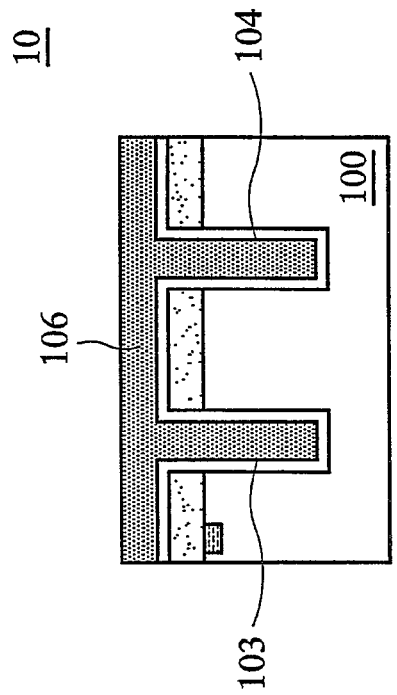
Figure 1C:
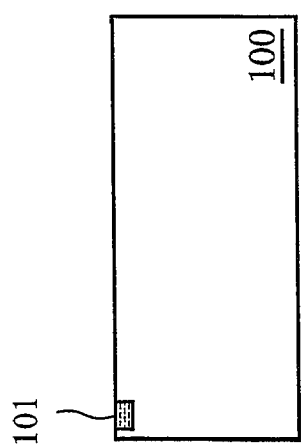

With reference now to FIG. 1A, there is shown a cross-sectional diagram of wafer 10. Wafer 10 comprises substrate 100, which is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like, and illustrates device 101 processed from substrate 100. In FIG. 1B, insulating layer 102 is deposited on substrate 100 of wafer 10. One example of such insulating material that may be used is phosphosilicate glass (PSG). Etching is performed on wafer 10 to create via recesses 103 and 104, as shown in FIG. 1C. In order to prevent any conducting material from leaching into any active portions of the circuitry of wafer 10, liner oxide 105, such as silicon nitride, is deposited in a layer over wafer 10, including via recesses 103 and 104.

Figure 1D:
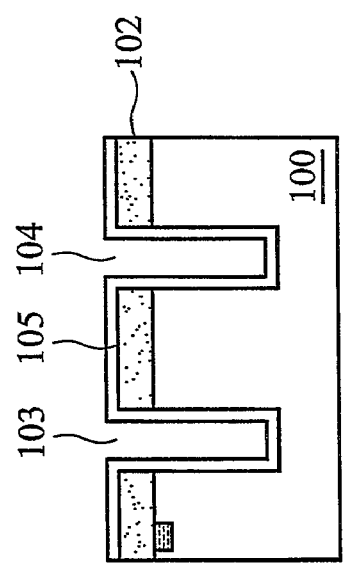
Figure 1E:
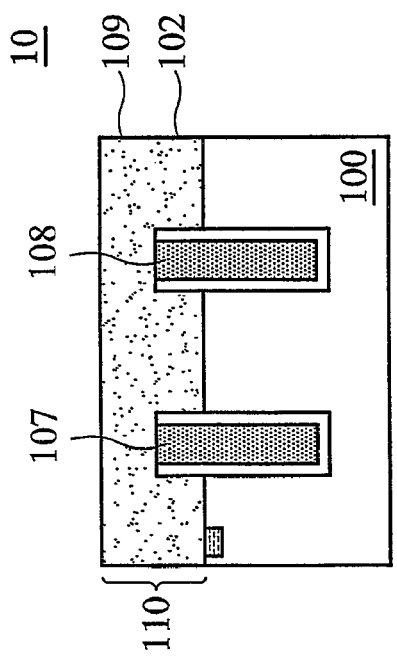
Figure 1F:
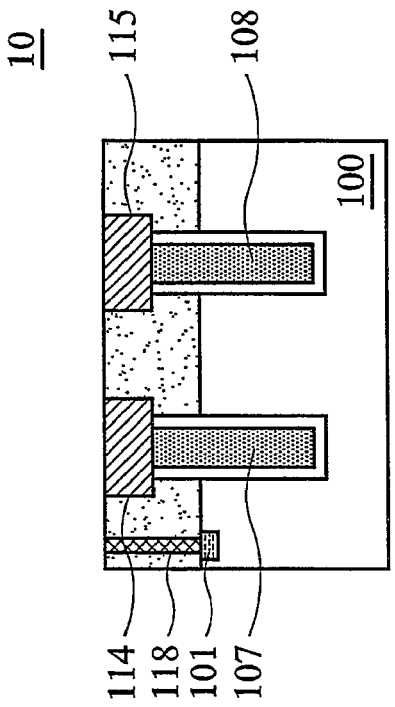

A layer of conducting material, conductor 106, is deposited onto wafer 10, as shown in FIG. 1D. Conducting material may comprise various materials, such as copper, tungsten, aluminum, gold, silver, and the like. Conductor 106 fills via recesses 103 and 104. After removing the excess portions of conductor 106, either through etching, chemical mechanical polishing (CMP), or the like, wafer 10 now comprises vias 107 and 108 deposited in substrate 100 and insulating layer 102, as shown in FIG. 1E. Additional insulating layer 109 is added on top of insulating layer 102 to form combined insulating layer 110, as illustrated in FIG. 1F, resulting in vias 107 and 108 being enclosed within wafer 10.

Figure 1G:
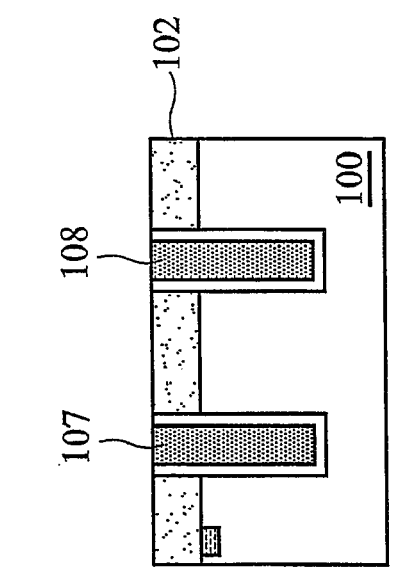
Figure 1H:
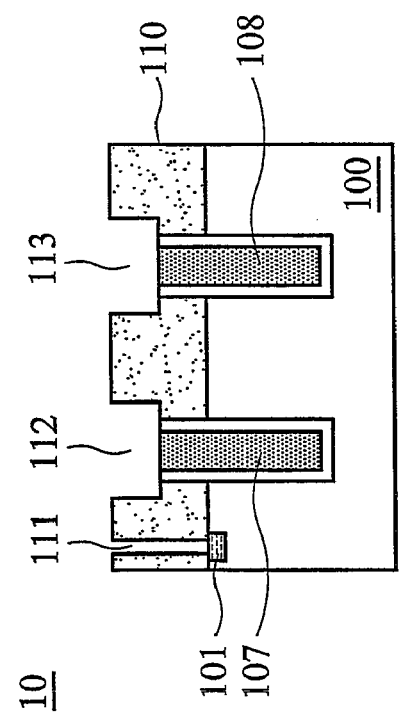

Another set of etching processes creates recesses 111-113, as shown in FIG. 1G, that provide contact to device 101 and vias 107 and 108, respectively through combined insulating layer 110. FIG. 1H illustrates wafer 10 in cross-section after conducting material is deposited onto wafer 10 filling in recesses 111-113 (FIG. 1G). Portions of this conducting material is then removed through a process, such as CMP, to create contact pad 114, contact pad 115, and connector 118, providing contact to device 101.

It should be noted that an interface exists between contact pads 114 and 115 and vias 107 and 108. This interface may comprise a direct connection, as illustrated in FIG. 1H, but may also comprise an indirect connection, such as through interface 308 (FIG. 3). The various embodiments of the present invention are not limited to only direct connection interfaces between contacts and vias.

Figure 1J:
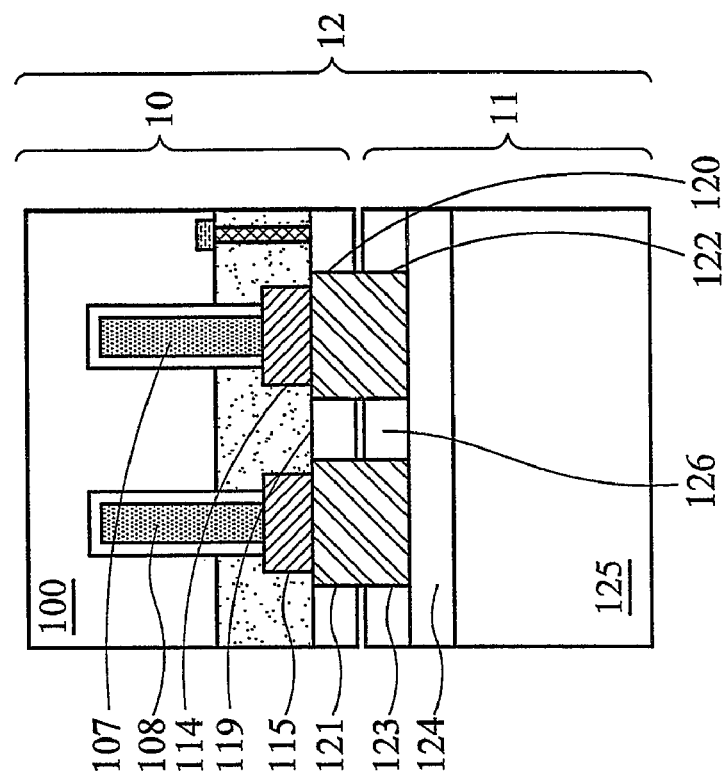
Figure 1I:
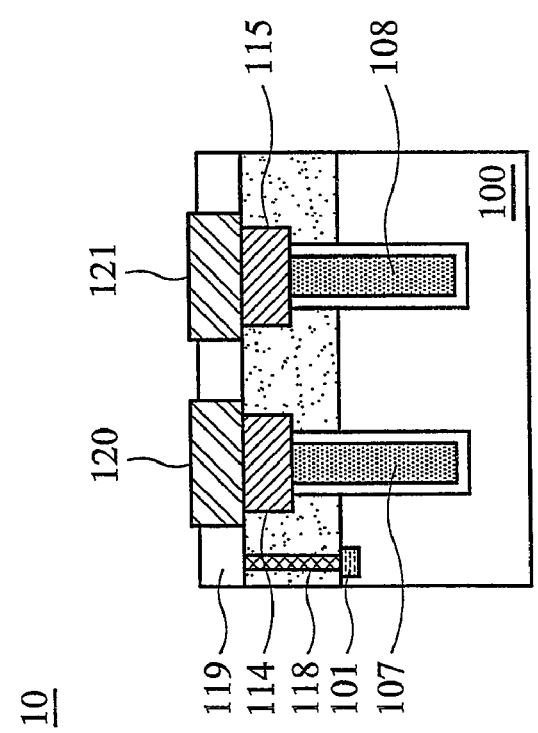

Bonding contacts 120 and 121, as shown in FIG. 1I, are formed by depositing intermetal dielectric (IMD) layer 119, which insulates device 101 from any other circuitry or devices in any wafers bonded to wafer 10. Recesses are etched into IMD layer 119 into which conducting material is deposited to form bonding contacts 120 and 121. The insulation or dielectric material making up IMD layer 119 is removed or etched to reveal bonding contacts 120 and 121 slightly elevated above the top of IMD layer 119.

It should be noted that the bonding contacts 120 and 121 are not limited to the positions in relation to contact pads 114 and 115, as illustrated in FIG. 1I. However, a connection between bonding contacts 120 and 121 to contact pads 114 and 115 should exist in some manner, such as a redirection layer, conducting traces, or the like.

FIG. 1J illustrates the cross-section of wafer 10 stacked and bonded to wafer 11. Wafer 11 comprises substrate 125, insulating layer 124, and IMD layer 126. Each of wafer 10 and 11 include an intermetal dielectric layer, IMDs 119 and 126 respectively, to limit interference between the various components on either wafer. Wafers 10 and 11 are bonded together at bonding pads 120-121 and 122-123 to form stacked wafer 12.

It should be noted that any number of different devices, components, connectors, and the like may be integrated into wafers 10 and 11. The specific devices or lack of devices that may be illustrated herein are not intended to limit the embodiments of the present invention in any way.

Figures 1K, 1L:
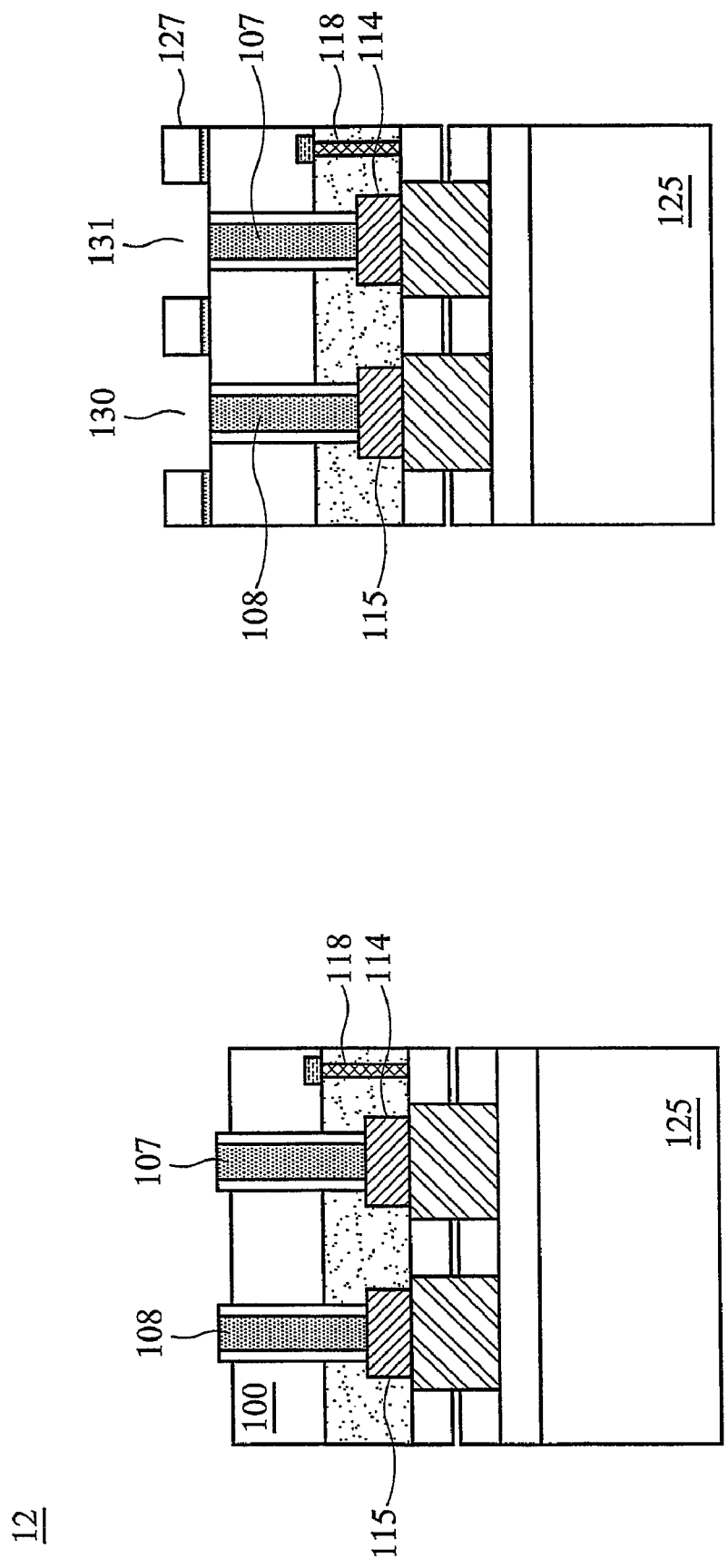
Figure 1M:
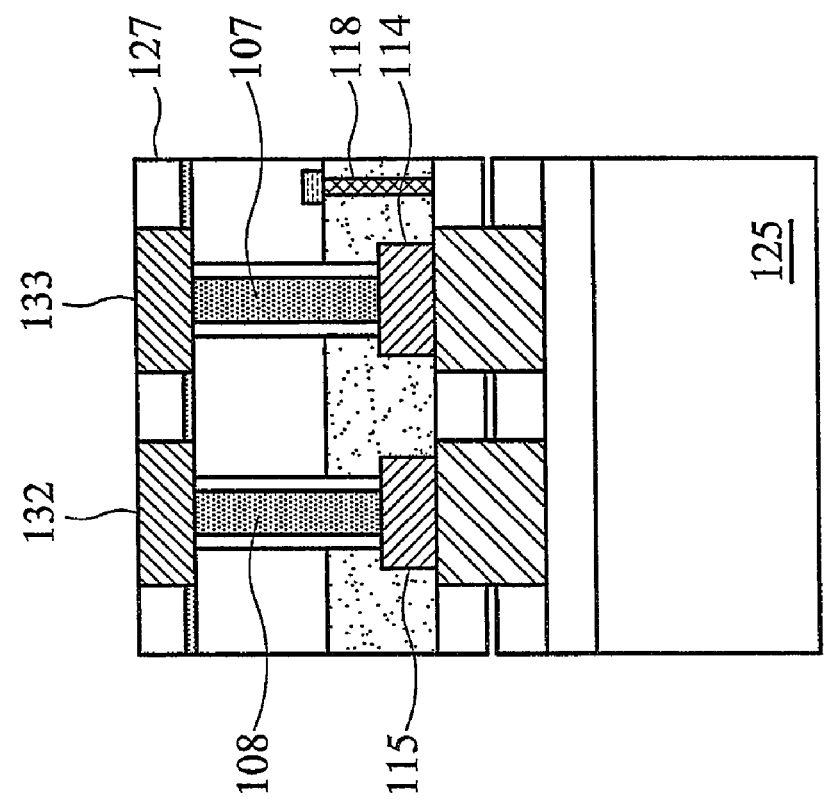

FIG. 1K is a cross-sectional view of stacked wafer 12 configured according to one embodiment of the present invention. In order to provide back-side contact points for vias 107 and 108, portions of substrate 100 are removed, through a process, such as etching, CMP, or the like, to reveal contact points with vias 107 and 108. In removing such portions of substrate 100, vias 107 and 108 slightly protrude from substrate 100. Metallization insulator layer 127 is deposited onto stacked die 12 over the protruding edges of vias 107 and 108, as shown in FIG. 1L. Metallization insulator layer 127 comprises layers of insulating material with a layer of liner material to prevent any metals deposited in the metallization process from leaching into stacked wafer 12. Recesses 130 and 131 are then etched from metallization insulator layer 127. The metallization process results in the formation of contact pads 132 and 133, as shown in FIG. 1M. A metal, such as copper, tungsten, aluminum, or the like, is deposited over metallization insulation layer 127 and then etched or removed until wafer 12 appears as illustrated in FIG. 1M. Thus, vias 107 and 108 have been fully formed prior to metallization and the formation of contact pads 132 and 133.

It should be noted that only a limited number of active devices, such as device 101, and vias, such as vias 107 and 108, are shown for the ease of illustration and clarity. However, those of ordinary skill in the art will appreciate that, in practice, the integrated circuitry associated with integrated circuits and stacked die may include millions or even tens of millions or more active devices and, further, that interconnect structures may include tens or even hundreds of conductors in the uppermost ILD layers. Similarly, those of ordinary skill in the art will appreciate that each stacked die will, in practice, include dozens of back-side connections using conductive vias and leads.

FIG. 2 is a cross-sectional view of wafer 20 having vias 202 and 203 formed in substrate 200 and dielectric layer 201 according to one embodiment of the present invention. Wafer 20 is an example implementation of vias 202 and 203 having contact sets 204 and 205 which are both smaller than the width of vias 202 and 203 and provide multiple electrical access points to vias 202 and 203.

FIG. 3 is a cross-sectional view of wafer 30 having vias 304 and 305 formed in substrate 300 and TSV dielectric layer 301 according to one embodiment of the present invention. Wafer 30 is an example implementation of vias 304 and 305 having an interface, interface 308, between itself and contacts 306 and 307. In the illustrated embodiment, contacts 306 and 307 are not in alignment with vias 304 and 305. Interface 308 provides the electrical connection between contacts 306 and 307 and vias 304 and 305. Wafer 30 also includes dielectric layer 302 between TSV dielectric layer 301 and contact dielectric layer 303.

FIG. 4 is a cross-sectional view of wafer 40 having vias 404 and 405 formed in substrate 400 and TSV dielectric layer 403 according to one embodiment of the present invention. Wafer 40 is an example implementation of vias 404 and 405 having contacts 406 and 407 which are the same width as vias 404 and 405 and which include dielectric layer 402 between TSV dielectric layer 403 and contact dielectric layer 401.

It should be noted that additional and/or alternative embodiments of the present invention may leave dielectric layer 402 out of the structure of a wafer, such as wafer 40.

Figure 5A:
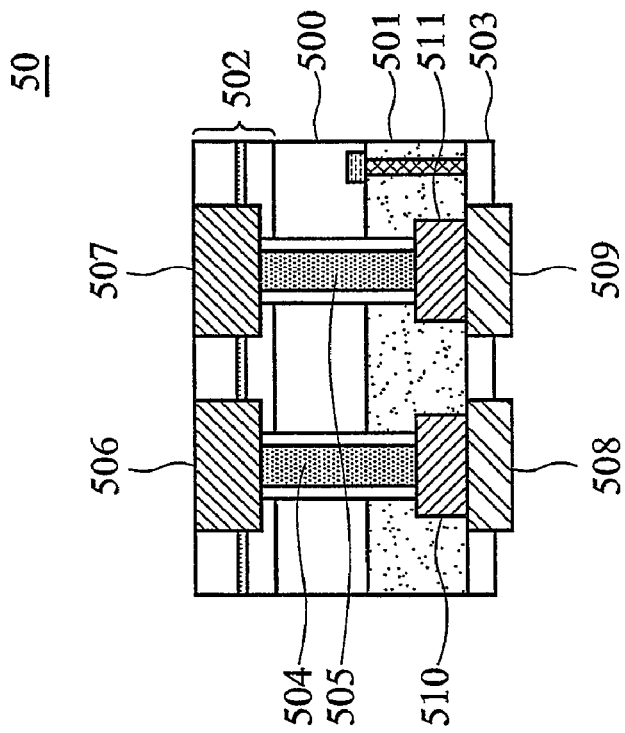
FIG. 5A is a cross-sectional view of a wafer having vias formed in the substrate and dielectric layer according to one embodiment of the present invention.

FIG. 5A is a cross-sectional view of wafer 50 having vias 504 and 505 formed in substrate 500 and dielectric layer 501 according to one embodiment of the present invention. Wafer 50 is an example implementation of vias 504 and 505 including both front-side and back-side contacts through wafer interconnect structures. The example embodiment of wafer 50 depicted in FIG. 5A provides back-side metallization through bonding pads 506 and 507. Here, back-side insulating layer 502, which includes at least one insulating oxide layer and an etch stop or barrier layer, has been thinned to expose bonding pads 506 and 507 in a slight protrusion above back-side insulating layer 502. The front-side of wafer 50 also includes metallized bonding pads 508 and 509 formed in oxide layer 503 connected to contacts 510 and 511.

Figure 5B:
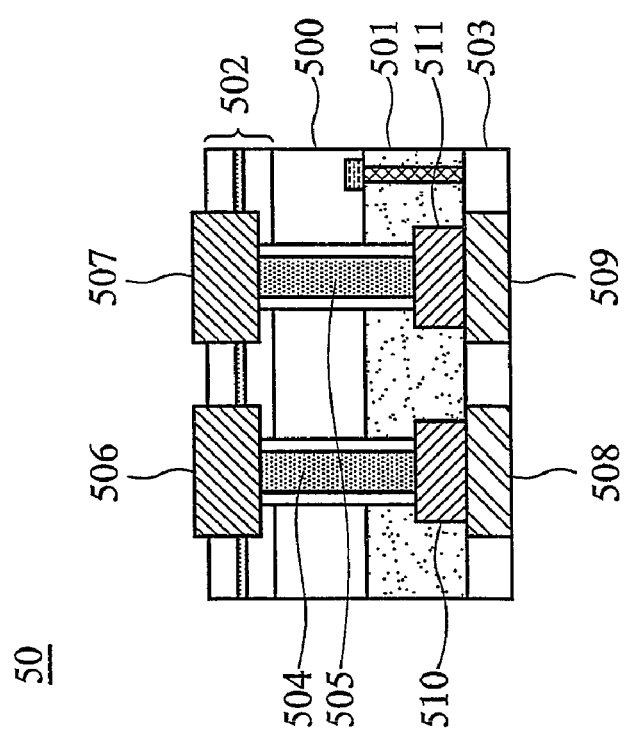
FIG. 5B is a cross-sectional view of a wafer having vias formed according to one embodiment of the present invention.

FIG. 5B is a cross-sectional view of wafer 50 having vias 504 and 505 formed according to one embodiment of the present invention. In the embodiment of wafer 50 depicted in FIG. 5B, insulating layer 502 is flush with bonding pads 506 and 507 on the back-side, while oxide layer 503 has been thinned to expose metallized bonding pads 508 and 509, which protrude slightly from oxide layer 503.

It should be noted that each of the example wafers described and illustrated in FIGS. 2-5 are meant to provide alternative implementations of vias, contact pads, and bonding pads that may be used with various embodiments of the present invention. In additional and/or alternative embodiments of the present invention, any combination of the illustrated options may be used. The illustrated embodiments are not intended to limit the implementation of the various additional and/or alternative embodiments of the present invention.

It should further be noted that the different layers described in the illustrated embodiments may comprise various different materials depending on the desired function or availability that the manufacturer determines. The metals used for the metallized bonding pads may be any suitable metal or alloy, such as copper, tungsten, aluminum, aluminum-copper, and the like. Moreover, depending on the desired use or function of the different dielectric or insulating layers, any such dielectric material may be used, such as silicon dioxide, silicon nitride, silicon carbide, silicon oxynitride, and the like. The present invention is not limited to use with only a certain limited number of compounds and materials.

It should further be noted that the different layers and recesses in the illustrated embodiments may be deposited or created using any number of a variety of known processes. For example, creation of the various layers of oxides, dielectrics, or other layers may be accomplished through chemical vapor deposition (CVD), atomic layer deposition (ALD), or the like. Moreover, removing material from the wafer may be accomplished through dry or wet etching, chemical mechanical polishing CMP), or the like. The present invention is not limited to any single such method.

When compared to existing methods for forming TSV in semiconductor devices, the TSV formed according to the various embodiments of the present invention results in structurally different vias. For example, with current methods that form the TSV after metallization layers, the location or placement of the bonding pads will correspond to the location of the TSV. There is no additional conductor routing available that can electrically connect the TSV to a bonding pad at a different location. In the present application, as illustrated in FIG. 1H and element 803 of FIG. 8, contacts are formed in an ILD after the TSVs have been formed through the substrate. Therefore, the bonding pads may be placed in any desired configuration and have electrical connections through the contacts in the ILD layers to selected TSVs. This novel structure allows more flexibility in the semiconductor device design. For example, forming a TSV prior to any ILD layers allows for the designer to provide for a TSV directed to thermal dissipation without sacrificing design space left after the ILD and IMD layers have already been formed.

Figure 6A:
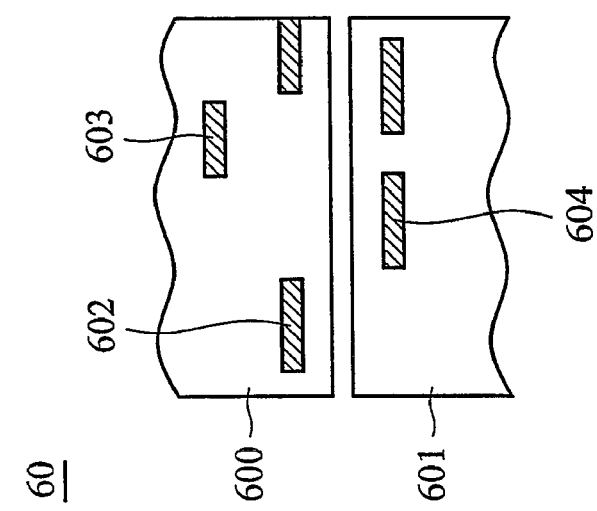
FIG. 6A is a cross-sectional view illustrating a stacked wafer.

Because the existing methods for creating TSVs occurs after the contact or metallization processes, individual wafers are typically joined either through direct bonding of oxide layers or through an adhesive applied to ILD layers. Once bonded through these methods, the TSVs are formed to provide the electrical connections between wafer layers. For example, FIG. 6A is a cross-sectional view illustrating stacked wafer 60. Wafer 600 includes, at least, devices 602 and 603 integrated thereon. Wafer 601 includes, at least, device 604. When wafers 600 and 601 are joined into a stacked configuration, the oxide layers of wafers 600 and 601 are directly bonded. Then, using one of the existing methods, the TSV are formed after the bonding in order to effect the electrical connections between devices 602-604 on wafers 600 and 601.

Figure 6B:
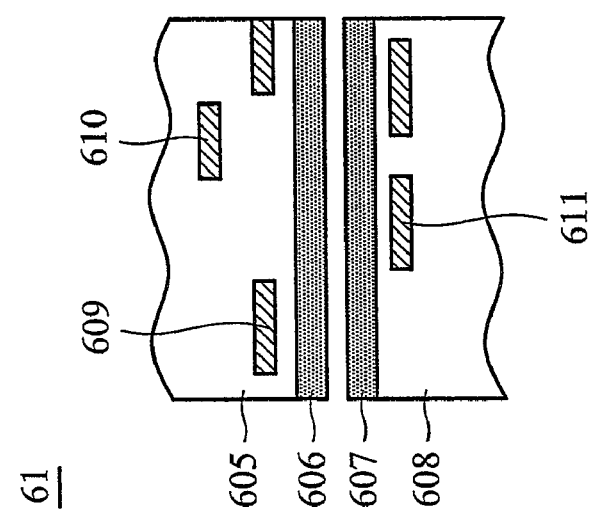
FIG. 6B is cross-sectional view illustrating another stacked wafer.

FIG. 6B is a cross-sectional view illustrating stacked wafer 61. Wafer 605 includes, at least, devices 609 and 610. Adhesive layer 606 has been added to the ILD layer of wafer 605 to facilitate bonding to wafer 608. Wafer 608, in turn, includes, at least, device 611, and has also been modified with adhesive layer 607. Wafers 605 and 608 are joined by pressing each other together to initiate contact between adhesive layers 606 and 607. After this bonding process, TSVs would then be manufactured in order to supply the electrical connections between devices 609-611 of the newly formed stacked wafer 61.

Figure 6C:
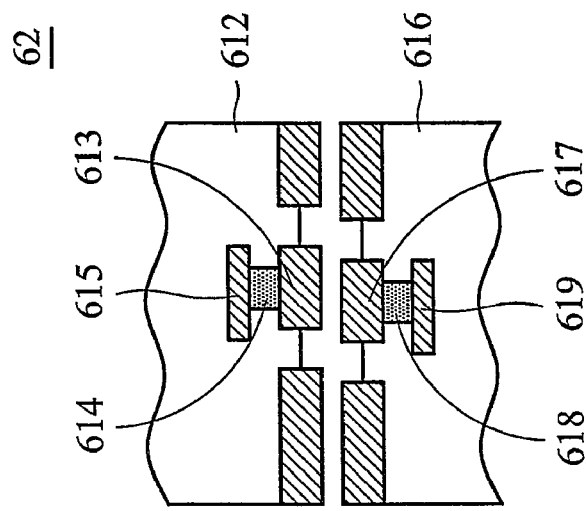
FIG. 6C is a cross-sectional view illustrating a stacked wafer that has been bonded according to one embodiment of the present invention.

FIG. 6C is a cross-sectional view illustrating stacked wafer 62 that has been bonded according to one embodiment of the present invention. Wafer 612 includes, at least, bonding pad 613, which was formed, at least in general, according to the process described in FIGS. 1A-1M. As such, bonding pad 613 forms an electrical connection with contact 614, which provides electrical connection to device 615. Wafer 616 also includes, at least, bonding pad 617, contact 618, and device 619, which were also formed, at least in general, according to the process described in FIGS. 1A-1M. Wafers 612 and 616 are joined into stacked wafer 62 by directly bonding bonding pads 613 and 617 together. When bonding pads 613 and 617 are metal, the bonding may be beneficially implemented using a compatible metal, thus, creating a strong physical bond as well as a secure and definite electrical connection. Thus, wafers 612 and 616 are connected with a strong physical and electrical bond.

It should be noted that any of several different conductive materials may be used to create the bonding pads in the various additional and/or alternative embodiments of the present invention to create the bond between those bonding pads. For example, the bonding material may be copper, tungsten, copper-tin alloy, gold-tin alloy, indium-gold alloy, lead-tin alloy, or the like. The present invention is not intended to be limited to any one or a simple set of such conductive materials.

Figure 7:
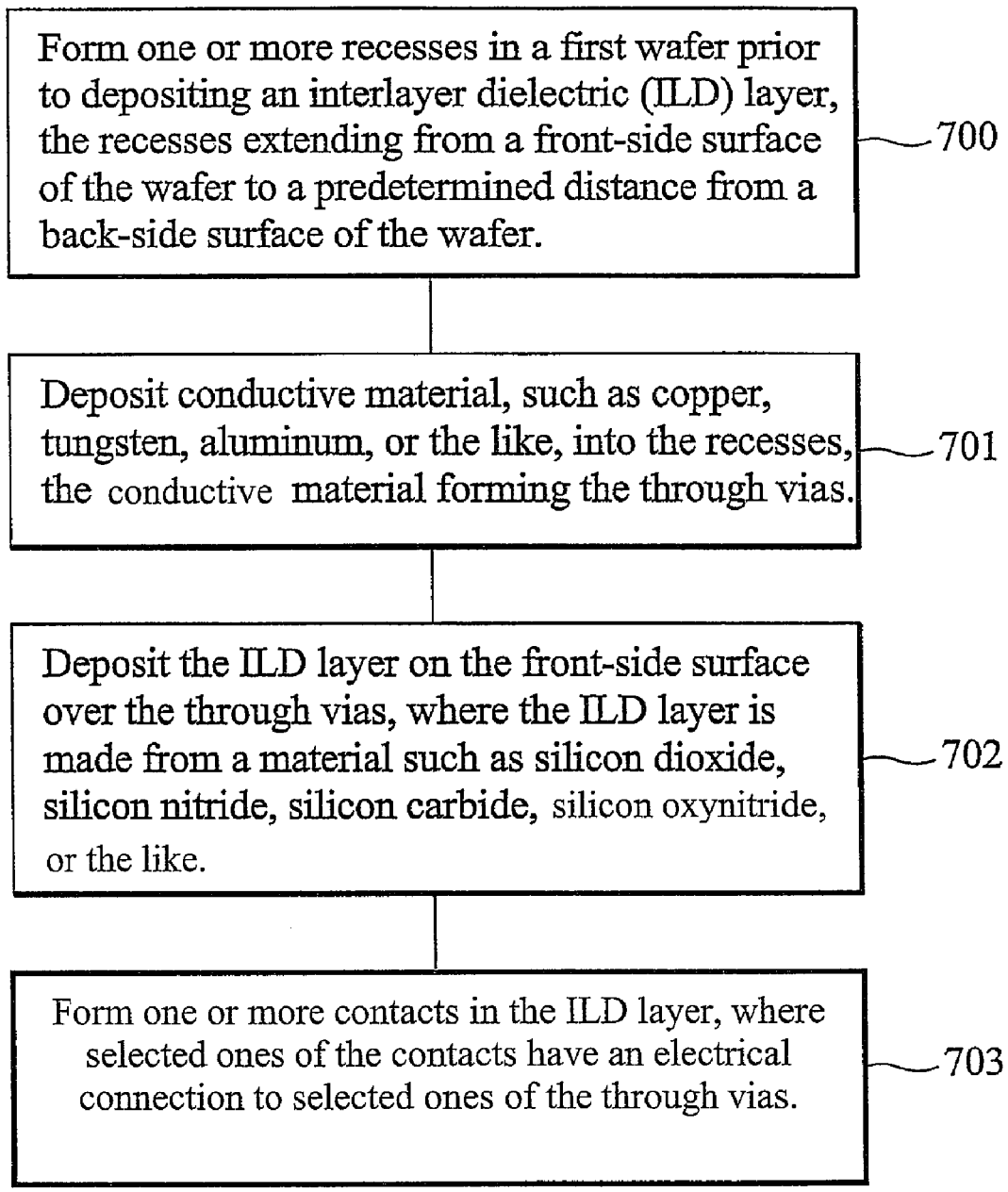
FIG. 7 is a flowchart illustrating example steps executed to implement one embodiment of the present invention.

FIG. 7 is a flowchart illustrating example steps executed to implement one embodiment of the present invention. In step 700, one or more recesses are formed in a first wafer prior to depositing an interlayer dielectric (ILD) layer. The recesses extend from a front-side surface of the wafer to a predetermined distance from a back-side surface of the wafer. Conductive material, such as copper, tungsten, aluminum, or the like, is deposited into the recesses, in step 701, the conductive material forming the through vias. The ILD layer is deposited, in step 702, on the front-side surface over the through vias, where the ILD layer is made from a material such as silicon dioxide, silicon nitride, silicon carbide, silicon oxynitride, or the like. In step 703, one or more contacts are formed in the ILD layer, where selected ones of the contacts have an electrical connection to selected ones of the through vias.

Figure 8:
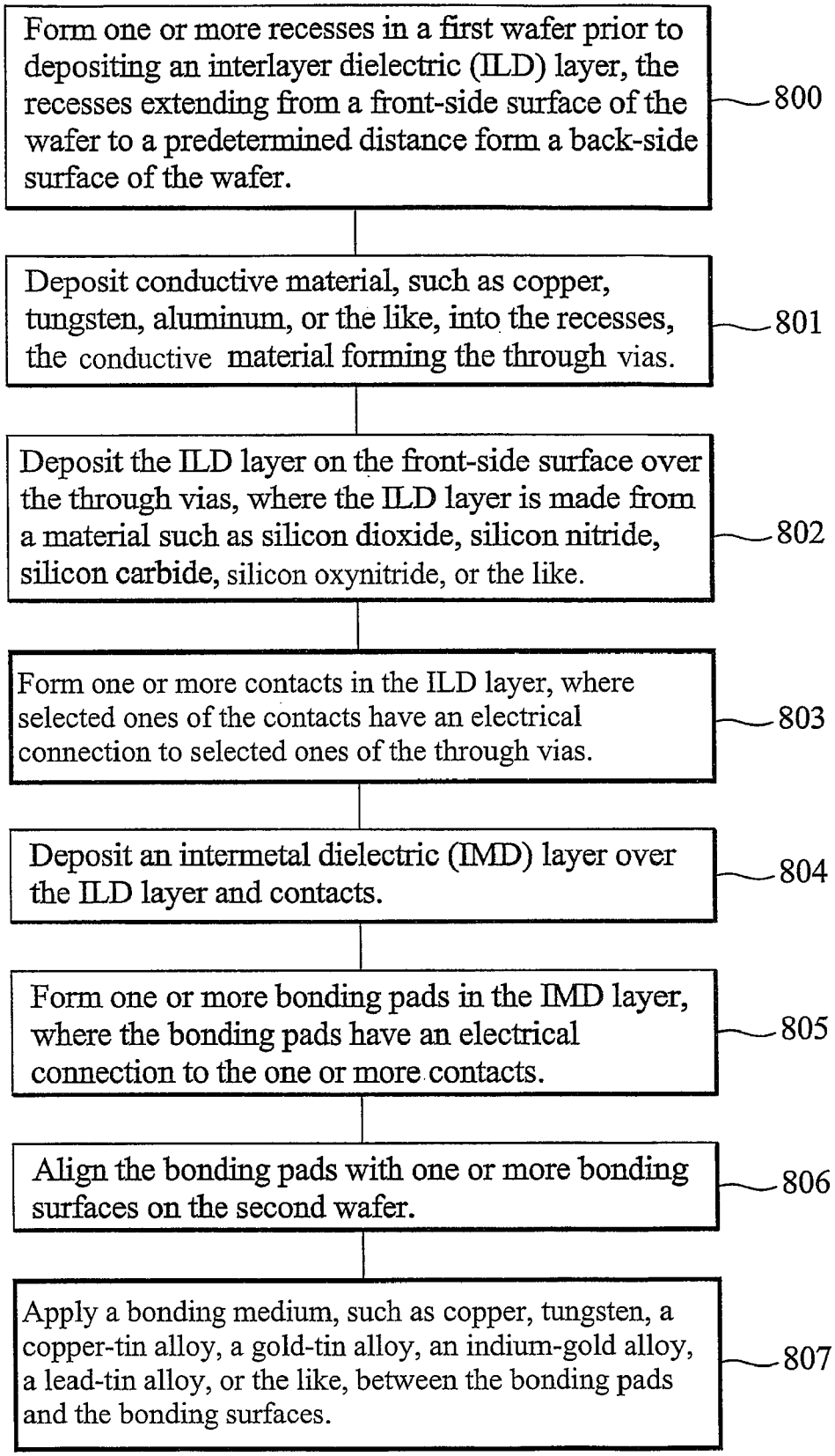
FIG. 8 is a flowchart illustrating example steps executed to implement one embodiment of the present invention.

FIG. 8 is a flowchart illustrating example steps executed to implement one embodiment of the present invention. In step 800, one or more recesses are formed in a first wafer prior to depositing an interlayer dielectric (ILD) layer. The recesses extend from a front-side surface of the wafer to a predetermined distance from a back-side surface of the wafer. Conductive material, such as copper, tungsten, aluminum, or the like, is deposited, in step 801, into the recesses, the conductive material forming the through vias. In step 802, the ILD layer is deposited on the front-side surface over the through vias, where the ILD layer is made from a material such as silicon dioxide, silicon nitride, silicon carbide, silicon oxynitride, or the like. One or more contacts are formed, in step 803, in the ILD layer, where selected ones of the contacts have an electrical connection to selected ones of the through vias. An intermetal dielectric (IMD) layer is deposited, in step 804, over the ILD layer and contacts. In step 805, one or more bonding pads are formed in the IMD layer, where the bonding pads have an electrical connection to the one or more contacts. The bonding pads are aligned with one or more bonding surfaces on the second wafer in step 806. In step 807, a bonding medium, such as copper, tungsten, a copper-tin alloy, a gold-tin alloy, an indium-gold alloy, a lead-tin alloy, or the like, is applied between the bonding pads and the bonding surfaces.

Figure 9:
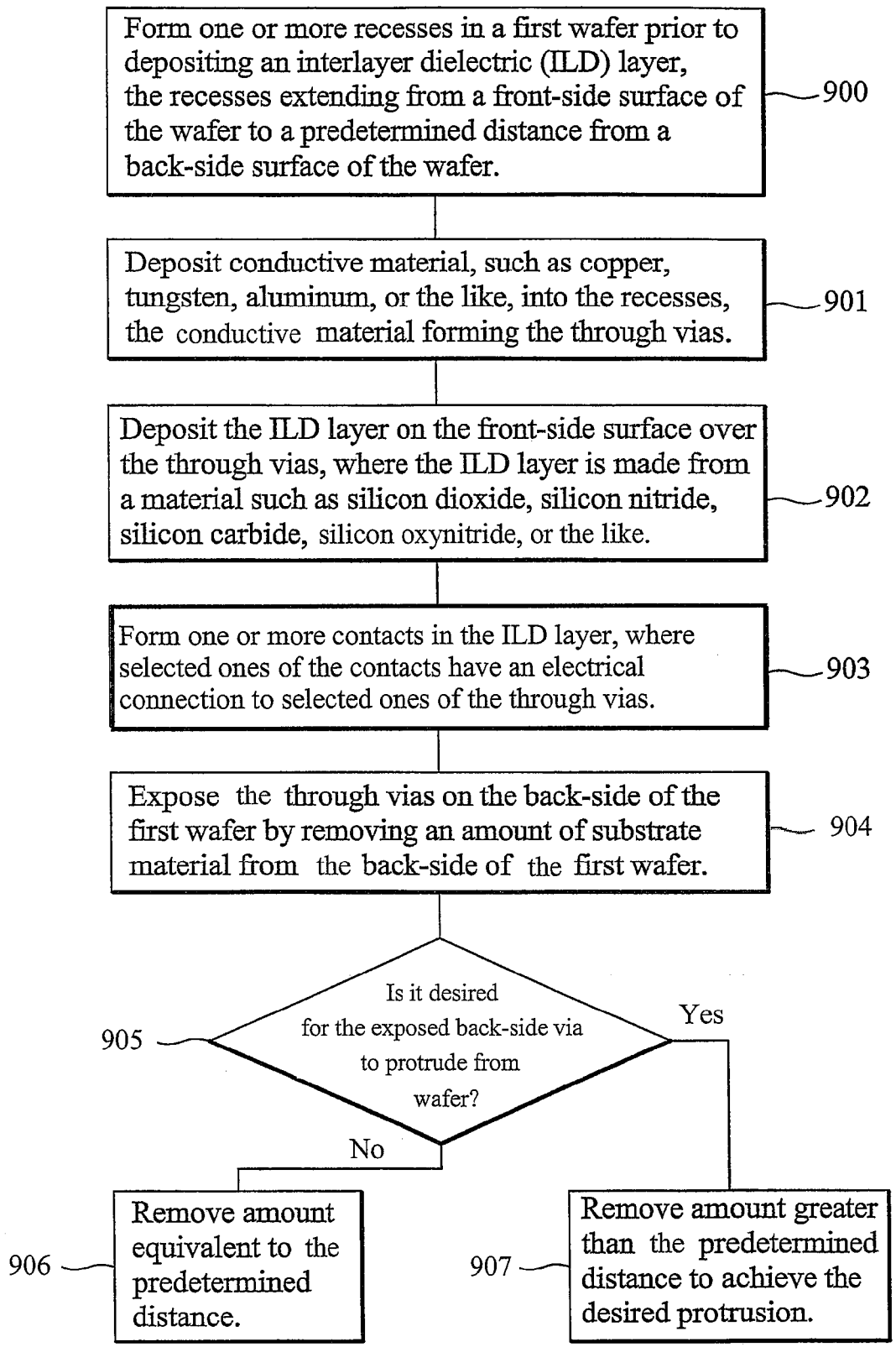
FIG. 9 is a flowchart illustrating example steps executed to implement one embodiment of the present invention.

FIG. 9 is a flowchart illustrating example steps executed to implement one embodiment of the present invention. In step 900, one or more recesses are formed in a first wafer prior to depositing an interlayer dielectric (ILD) layer. The recesses extend from a front-side surface of the wafer to a predetermined distance from a back-side surface of the wafer. Conductive material, such as copper, tungsten, aluminum, or the like, is deposited into the recesses, in step 901, the conductive material forming the through vias. In step 902, the ILD layer is deposited on the front-side surface over the through vias, where the ILD layer is made from a material such as silicon dioxide, silicon nitride, silicon carbide, silicon oxynitride, or the like. One or more contacts are formed in the ILD layer, in step 903, where selected ones of the contacts have an electrical connection to selected ones of the through vias. The through vias are exposed on the back-side of the first wafer, in step 904, by removing an amount of substrate material from the back-side of the first wafer. In step 905, a determination is made whether it is desired for the exposed back-side via to protrude from the wafer. If not, then an amount equivalent to the predetermined distance is removed in step 909. Otherwise, an amount greater than the predetermined distance is removed, in step 907, to achieve the desired protrusion.

FIG. 10 is a flowchart illustrating example steps executed to implement one embodiment of the present invention. In step 1000, a first wafer, which has one or more bonding pads connected to at least one through silicon via (TSV) that provides an electrical connection to one or more components on the first wafer, is positioned. A second wafer is positioned, in step 1001, in relation to the first wafer, the second wafer having one or more bonding pads connected to at least one TSV that provides the electrical connection to one or more components on the second wafer. The bonding pads of the first and second wafers are bonded, in step 1002, using a material, such as copper, tungsten, gold, copper-tin alloy, gold-tin alloy, indium-gold alloy, lead-tin alloy, or the like, that is electrically compatible with the bonding pads.

Figure 11:
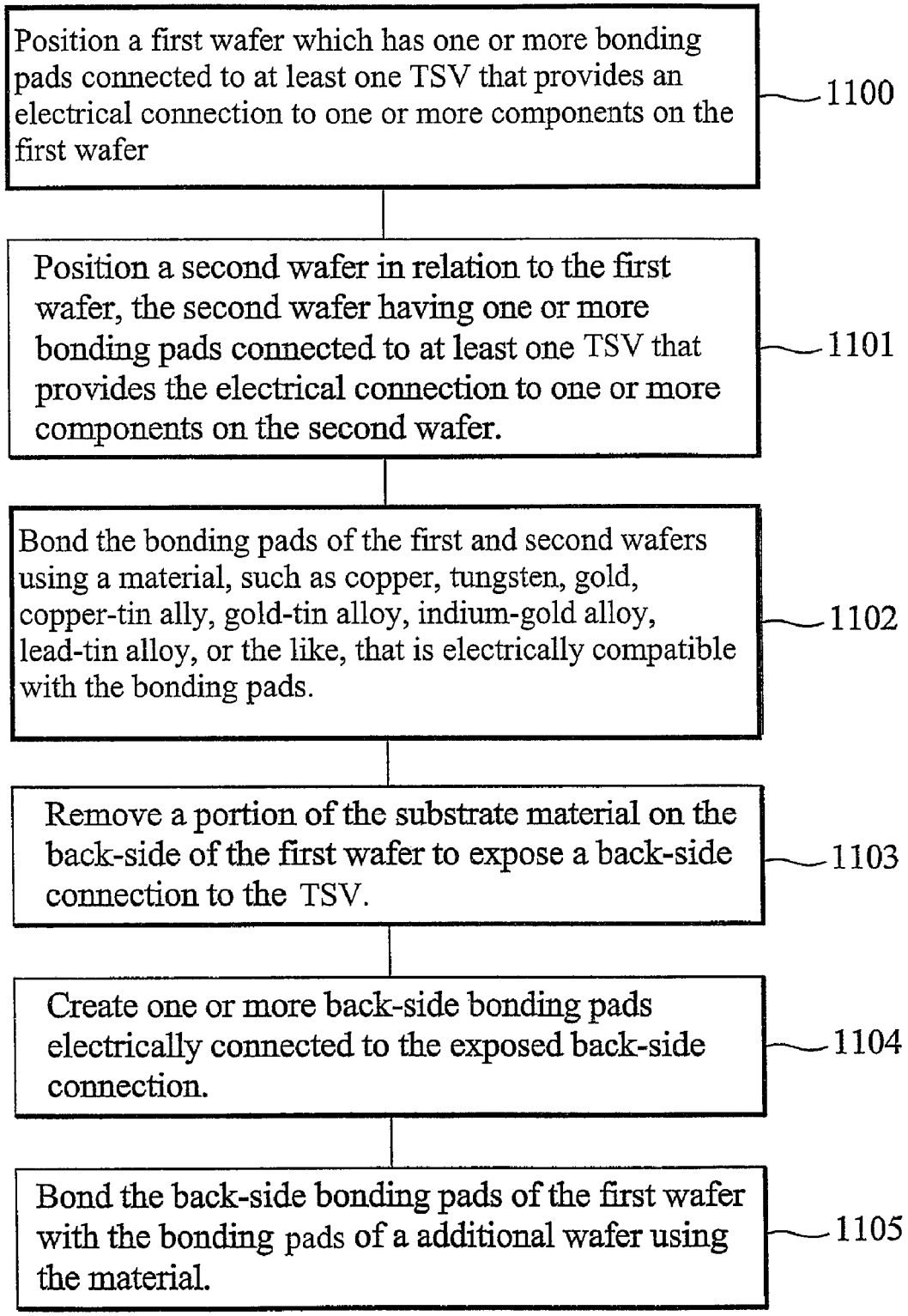
FIG. 11 is a flowchart illustrating example steps executed to implement one embodiment of the present invention.

FIG. 11 is a flowchart illustrating example steps executed to implement one embodiment of the present invention. In step 1100, a first wafer which has one or more bonding pads connected to at least one TSV that provides an electrical connection to one or more components on the first wafer is positioned. A second wafer is positioned, in step 1101, in relation to the first wafer, the second wafer having one or more bonding pads connected to at least one TSV that provides the electrical connection to one or more components on the second wafer. The bonding pads of the first and second wafers are bonded, in step 1102, using a material, such as copper, tungsten, gold, copper-tin alloy, gold-tin alloy, indium-gold alloy, lead-tin alloy, or the like, that is electrically compatible with the bonding pads. A portion of the substrate material on the back-side of the first wafer is removed, in step 1103, to expose a back-side connection to the TSV. One or more back-side bonding pads are created, in step 1104, that are electrically connected to the exposed back-side connection. The back-side bonding pads of the first wafer are bonded with the bonding pads of an additional wafer, in step 1105, using the material.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A stacked integrated circuit (IC) comprising:
   a first semiconductor die having a front-side and a back-side, wherein said first semiconductor die contains a substrate and one or more active devices on the substrate;
   one or more through silicon vias (TSVs) running through the substrate and a front-side insulation layer of said first semiconductor die;
   an inter-layer dielectric (ILD) layer on said front-side of said first semiconductor die, said ILD layer having at least one contact physically connected to a front-side of said one or more TSVs and an interface between said at least one contact and said one or more TSVs;
   an inter-metal dielectric (IMD) layer on said ILD layer, said IMD layer having at least one bonding pad electrically connected to said at least one contact;
   a second semiconductor die connected to said first semiconductor die at said at least one bonding pad; and
   a metallization layer on said back-side of said first semiconductor die, wherein said metallization layer comprises:
      at least one back-side dielectric layer over said back-side; and
      an etch-stop layer over one of said at least one back-side dielectric layers;
   said metallization layer having at least one back-side contact having a first side electrically connected to a back-side of said one or more TSVs and a second side opposite the first side exposed to allow current to flow through the second side.

2. The stacked IC of claim 1 further comprising:
   one or more conducting traces between said one or more TSVs and said one or more components.

3. The stacked IC of claim 1 wherein each of said at least one contacts is aligned with a corresponding one of said one or more TSVs.

4. A semiconductor component comprising:
   a substrate, said substrate having a front-side and a back-side, wherein said substrate includes one or more integrated circuit (IC) active devices on the front-side of the substrate;
   at least one through silicon via (TSV) extending through said substrate from said front-side to said back-side and extending above said back-side;
   an interlayer dielectric (ILD) layer on said front-side of said substrate, wherein said ILD layer includes one or more contacts connected to said at least one TSV and an interface between said one or more contacts and said at least one TSV;
   an intermetal dielectric (IMD) layer on said ILD layer, wherein said IMD layer includes one or more bond pads connected to said one or more contacts; and
   a passivation layer on said back-side of said substrate, wherein said passivation layer includes a barrier layer and one or more back-side contacts connected to said at least one TSV, wherein the one or more back-side contacts have a first surface facing away from the substrate, the one or more bond pads have a second surface facing away from the substrate, and the first surface and second surface are exposed for electrical contact.

5. The semiconductor component of claim 4 wherein said one or more contacts are aligned with corresponding ones of said at least one TSV.

6. The semiconductor component of claim 4 further comprising:
   an insulator layer between said front-side of said substrate and said ILD layer, wherein said at least one TSV extends through said insulator layer.

7. The semiconductor component of claim 4 further comprising:
   one or more conductors connecting said at least one TSV and said one or more IC components.

8. The semiconductor component of claim 4 wherein said one or more contacts comprises one of:
   a width equal to a TSV width;
   said width greater than said TSV width; and
   said width smaller than said TSV width.

9. The semiconductor component of claim 4 wherein said one or more contacts comprises an array.

10. A semiconductor component comprising:
    two or more stacked dies each stacked die having one or more devices integrated therein;
    at least one through silicon via (TSV) located in each of said two or more stacked dies, wherein each of said at least one TSVs extends from a front-side of a substrate of each of said two or more stacked dies through a back-side of said substrate, wherein said at least one TSV extends out from said back-side, wherein the at least one TSV extends through an internal portion of said two or more stacked dies and wherein front-sides of separate substrates face each other, the front-sides each having a device integrated therein;
    a front-side dielectric layer on said front-side of said substrate of each of said two or more stacked dies;
    a back-side dielectric layer on said back-side of said substrate of each of said two or more stacked dies, said back-side dielectric layer including an etch-stop layer; and one or more contacts within said front-side dielectric layer and said back-side dielectric layer, wherein said one or more contacts are electrically connected to said at least one TSV and an interface between said one or more contacts and said at least one TSV, and wherein said two or more stacked dies are connected to each other through said one or more contacts.

11. The semiconductor component of claim 10 wherein selected ones of said one or more contacts are aligned with corresponding ones of said at least one TSV.

12. The semiconductor component of claim 10 wherein said etch-stop layer consists essentially of a material selected from a group consisting of:

silicon dioxide;

silicon nitride;

silicon carbide; and silicon oxynitride.

13. The semiconductor component of claim 10 further comprising:

one or more additional dielectric layers formed on said etch-stop layer.

* * * * *